United States Patent
Malik

(10) Patent No.: US 6,385,617 B1
(45) Date of Patent: May 7, 2002

(54) METHOD AND APPARATUS FOR CREATING AND MANIPULATING A COMPRESSED BINARY DECISION DIAGRAM IN A DATA PROCESSING SYSTEM

(75) Inventor: Nadeem Malik, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/413,903

(22) Filed: Oct. 7, 1999

(51) Int. Cl.[7] .............................................. G06F 17/30
(52) U.S. Cl. ...................... 707/101; 707/100; 716/18
(58) Field of Search ................................ 707/100, 101, 707/102, 104; 716/18, 4

(56) References Cited

U.S. PATENT DOCUMENTS 5,469,367 A * 11/1995 Puri et al. ..................... 716/18

OTHER PUBLICATIONS

Byrant, Randal E.; Graph–Based Algorithms for Boolean Function Manipulation; IEEE Transaction on Computers; vol C–35; No. 8, Aug. 1986; pp. 677–691.

* cited by examiner

*Primary Examiner*—Sanjiv Shah
(74) *Attorney, Agent, or Firm*—Duke W. Yee; Mark E. McBurney

(57) ABSTRACT

A method and apparatus in a data processing system for manipulating a set of binary decision diagrams. A plurality of segments is created from the set of binary decision diagrams. A group of compression codes is associated with the set of segments, wherein the group of compression codes form a compressed data structure representing the set of binary decision diagrams.

26 Claims, 5 Drawing Sheets

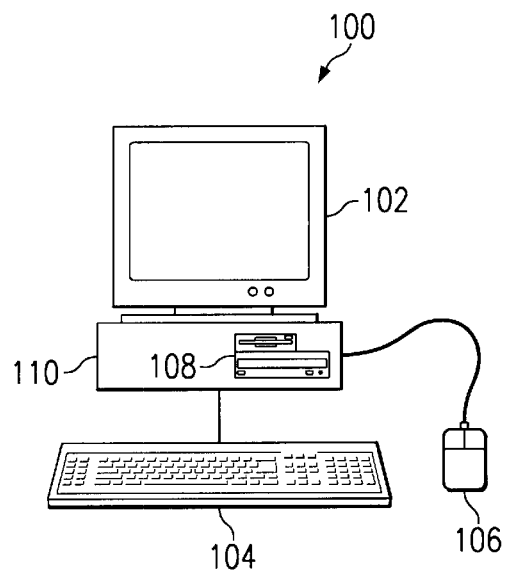
FIG. 1
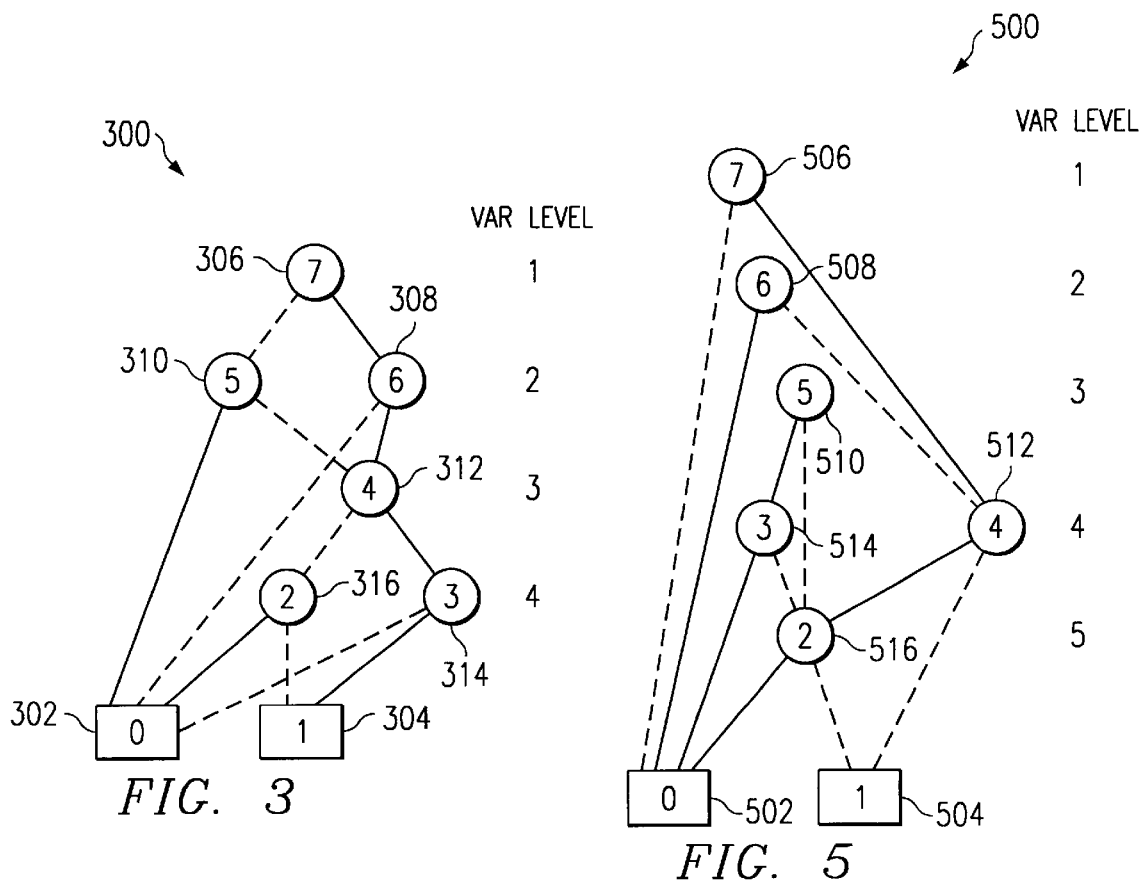
FIG. 3
FIG. 5

| INDEX 402 | VAR LEVEL A 404 | LOW A 406 | HIGH A 408 |
|---|---|---|---|
| 2 | 4 | 1 | 0 |
| 3 | 4 | 0 | 1 |
| 4 | 3 | 2 | 3 |
| 5 | 2 | 4 | 0 |
| 6 | 2 | 0 | 4 |
| 7 | 1 | 5 | 6 |

FIG. 4
400

| INDEX 602 | VAR LEVEL B 604 | LOW B 606 | HIGH B 608 |
|---|---|---|---|
| 2 | 5 | 1 | 0 |
| 3 | 4 | 2 | 0 |
| 4 | 4 | 1 | 2 |
| 5 | 3 | 2 | 3 |
| 6 | 2 | 4 | 0 |
| 7 | 1 | 0 | 4 |

FIG. 6
600

| INDEX (706) | VAR LEVEL A (702) | LOW A | HIGH A | VAR LEVEL B (704) | LOW B | HIGH B |
|---|---|---|---|---|---|---|
| 2 | 4 | 1 | 0 | 5 | 1 | 0 |
| 3 | 4 | 0 | 1 | 4 | 2 | 0 |
| 4 | 3 | 2 | 3 | 4 | 1 | 2 |
| 5 | 2 | 4 | 0 | 3 | 2 | 3 |
| 6 | 2 | 0 | 4 | 2 | 4 | 0 |
| 7 | 1 | 5 | 6 | 1 | 0 | 4 |

700
FIG. 7

|   | 0 | 1 | 2 | 3 | 4 | 5 |
|---|---|---|---|---|---|---|
| 0 | 4 | 1 | 0 | 5 | 1 | 0 |
| 1 | 4 | 0 | 1 | 4 | 2 | 0 |
| 2 | 3 | 2 | 3 | 4 | 1 | 2 |
| 3 | 2 | 4 | 0 | 3 | 2 | 3 |
| 4 | 2 | 0 | 4 | 2 | 4 | 0 |
| 5 | 1 | 5 | 6 | 1 | 0 | 4 |

FIG. 8

| | | | |
|---|---|---|---|
| 0 | 4 | 1 | 0 |
| 1 | 5 | 1 | 0 |
| 2 | 4 | 0 | 1 |
| 3 | 4 | 2 | 0 |
| 4 | 3 | 2 | 3 |
| 5 | 4 | 1 | 2 |
| 6 | 2 | 4 | 0 |
| 7 | 2 | 0 | 4 |
| 8 | 1 | 5 | 6 |
| 9 | 1 | 0 | 4 |

| 0 | 1 | 2 | 3 | 4 | 5 |
|---|---|---|---|---|---|
| 6 | 4 | 7 | 6 | 8 | 9 |

METHOD AND APPARATUS FOR CREATING AND MANIPULATING A COMPRESSED BINARY DECISION DIAGRAM IN A DATA PROCESSING SYSTEM

BACKGROUND OF THE INVENTION

1. Technical Field

The present invention relates generally to an improved data processing system and in particular to a method and apparatus for representing billing and functions. Still more particularly, the present invention relates to a method and apparatus for representing boolean functions using binary decision diagrams.

2. Description of Related Art

In designing circuits, many types of elements may be used in logic design and synthesis of circuits. Typically, these circuits include various components, such as, for example, gates and latches. In analyzing and manipulating these structures, the various elements are typically represented as nodes in a binary decision diagram (BDD). These BDD's are widely used as a data structure for representing boolean expressions in design automation tools. These BDD's have emerged as the representation of choice for many other applications, including digital circuit design. Many formal verification techniques, including model checking, equivalence checking, optimization of combinatorial circuits, and test pattern generation, have a fundamental reliance on BDD's and their implementations. These type of diagrams have a disadvantage in that they grow very large very quickly. For example, using a BDD to represent a 16-bit multiplexer takes one half of a gigabyte of memory. With these increasing trends towards increased design complexity, an even greater demand on improving memory requirements for BDD's is present. Generally, memory requirements for BDD's grow exponentially with the number of boolean variables. Numerous improvements have been made on BDD structures, such as the efficient BDD package by Randall Bryant as described in Graph-Based Algorithms for Boolean Function Manipulation, IEEE Transactions on Computers, C-35 August 1998, pgs. 677–691. Even with improvements, memory requirements still pose a limiting factor to the use of BDD's for large diagrams. For example, in model checking, the BDD memory requirements have made it impossible to verify a full chip of any significant function in its entirety.

In an effort to reduce the amount of memory used by a BDD representation of a chip, compression of these diagrams have been used. Compression presently used may yield anywhere from a 2x to 10x reduction in many practical cases, excluding those in which data is statistically uniformly distributed, which is a rare situation. Lossless compression, however, renders the data unusable for random access. As a result, such compression is typically used only towards keeping data compressed for archival purposes and not for use during computation as in the case of BDD data.

Therefore, it would be advantageous to have an improved method and apparatus for compressing and manipulating BDD data in a manner that random access of the BDD data is provided.

SUMMARY OF THE INVENTION

The present invention provides a method and apparatus in a data processing system for manipulating a set of binary decision diagrams. A plurality of segments is created from the set of binary decision diagrams. A group of compression codes is associated with the set of segments, wherein the group of compression codes form a compressed data structure representing the set of binary decision diagrams.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 is a pictorial representation depicting a data processing system in which the present invention may be implemented;

FIG. 3 is a binary decision diagram (BDD) for a boolean function depicted in accordance with a preferred embodiment of the present invention;

FIG. 4 is a diagram illustrating the data structure for a BDD for a boolean function in a table format depicted in accordance with a preferred embodiment of the present invention;

FIG. 5 is a boolean decision diagram for a boolean function depicted in accordance with a preferred embodiment of the present invention;

FIG. 6 is a diagram of a table representation of the BDD in FIG. 5 depicted in accordance with a preferred embodiment of the present invention;

FIG. 7 is a table combining entries for two binary decision diagrams depicted in accordance with a preferred embodiment of the present invention;

FIG. 8 is a diagram of an array structure depicted in accordance with a preferred embodiment of the present invention;

DETAILED DESCRIPTION OF THE PREFERRED EMBODIMENT

Figure 2:
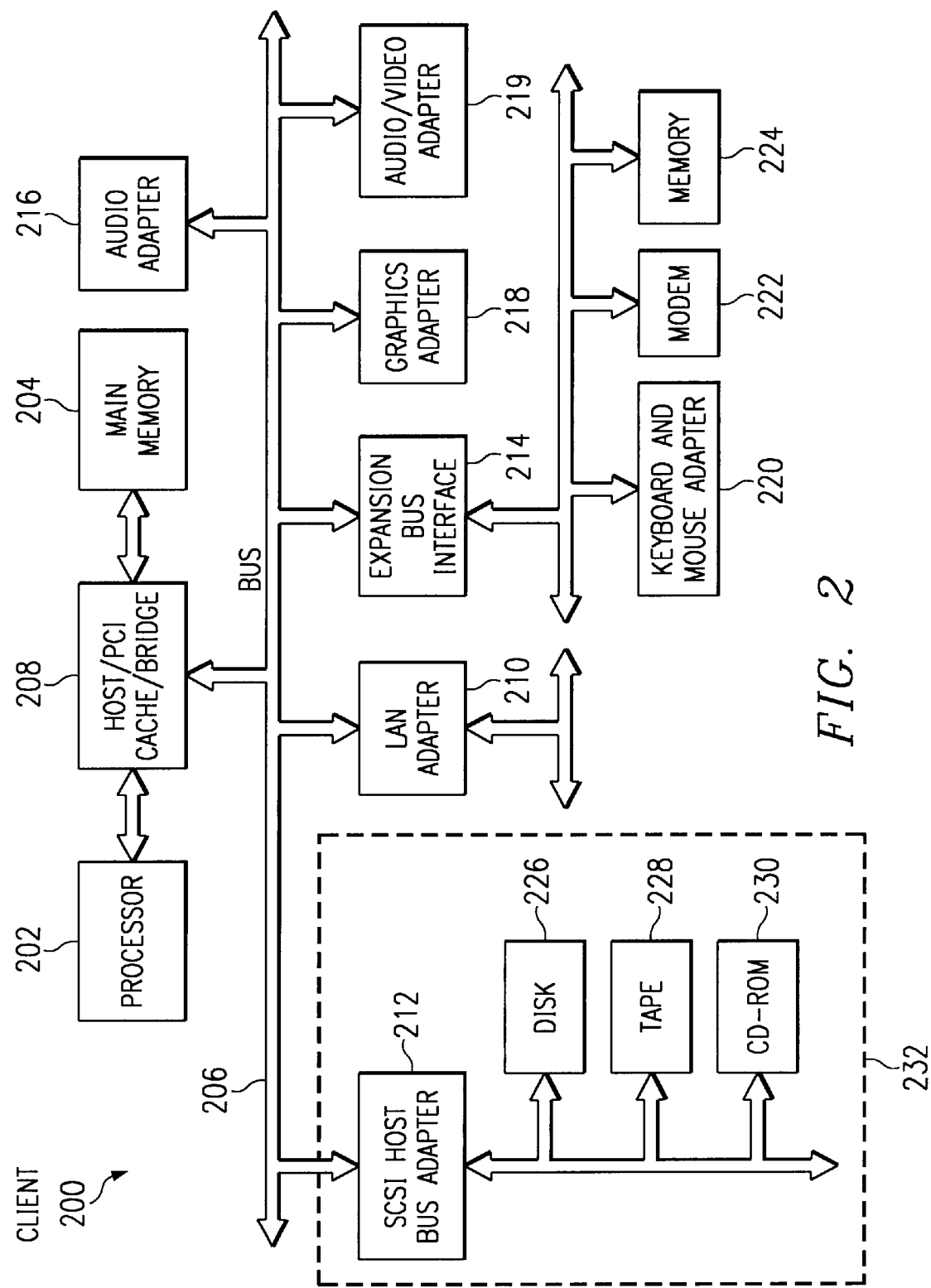
FIG. 2 is a block diagram illustrating a data processing system in which the present invention may be implemented.

With reference now to the figures and in particular with reference to FIG. 1, a pictorial representation depicting a data processing system in which the present invention may be implemented in accordance with a preferred embodiment of the present invention. A personal computer 100 is depicted which includes a system unit 110, a video display terminal 102, a keyboard 104, storage devices 108, which may include floppy drives and other types of permanent and removable storage media, and mouse 106. Additional input devices may be included with personal computer 100. Personal computer 100 can be implemented using any suitable computer, such as an IBM Aptiva™ computer, a product of International Business Machines Corporation, located in Armonk, N.Y. Although the depicted representation shows a personal computer, other embodiments of the present invention may be implemented in other types of data processing systems, such as network computers, Web based television set top boxes, Internet appliances, etc. Computer 100 also preferably includes a graphical user interface that may be implemented by means of systems software residing in computer readable media in operation within computer 100.

With reference now to FIG. 2, a block diagram illustrates a data processing system in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Micro Channel and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as OS/2, which is available from International Business Machines Corporation. "OS/2" is a trademark of International Business Machines Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented operating system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a Personal Digital Assistant (PDA) device which is configured with ROM and/or flash ROM in order to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

With reference now to FIG. 3, a binary decision diagram (BDD) for a boolean function is depicted in accordance with a preferred embodiment of the present invention. BDD 300 is for a function "A", containing four variable levels and six variables in this example. In some cases, more than one variable may share the same index level. For simplicity, in this example, nodes 302 and 304 with 0 and 1 are terminal nodes 302 or 304, representing false and true, respectively. Nodes 306–316 are internal nodes corresponding to the six variables in this example. In the depicted examples, a dotted line represents a false determination while a solid line represents a true determination for a variable.

Node 306 for variable 7 leads to node 308 for variable 6 if variable 7 is true and leads to node 310 for variable 5 if variable 7 is false. Variable 6 node 308 leads to variable 4 node 312 if true and leads to the false node 302 if false. Variable 5 node 310 leads to false 302 if true and leads to the variable 4 node 312 if false. Variable 4 node 312 leads to variable 3 node 314 if true and leads to variable 2 node 316 if false. Variable 3 node 314 leads to true node 304 if true and leads to false node 302 if false. The variable 2 node 316 is just the opposite. This node leads to false node 302 if true and to true node 304 if false.

With reference now to FIG. 4, a diagram illustrating the data structure for a BDD for a boolean function in a table format is depicted in accordance with a preferred embodiment of the present invention. Table 400 is a table representation of BDD 300 in FIG. 3. Table 400 includes table indices 0 and 1 which always represent the terminal nodes 0 and 1, respectively. These indices are not included in the table because they do not have any children. The table index in column 402 is the variable number. Three entries are present for each variable: the variable level in column 404, the child for the low (or false) condition in column 406, and the child for the high (or true) condition in column 408. This table is for boolean function "A" as represented by BDD 300 in FIG. 3, and the columns are labeled with an A, such as "var level A" "low A", and "high A". The three entries form a segment with table 400 depicting six segments.

With reference next to FIG. 5, a boolean decision diagram for a boolean function is depicted in accordance with a preferred embodiment of the present invention. A typical circuit may have hundreds of Boolean functions. To illustrate the techniques used in this invention, BDD 300 is for a boolean function called "B".

In a manner analogous to FIG. 3, two terminal nodes 502 and 504 are present for false (0) and true (1), respectively. Six variables and nodes 506–516 are present in which these nodes are organized into five levels. Node 506 is located in level one while node 508 is located in level two. Node 510 is located in level three while nodes 512 and 514 are located in level four. Node 516 is located in level five in this example. A solid line from a variable node is the path if the variable has a true value and a dashed line is the path if the variable has a false value. Assume the values of all variables are known, then to find the value of the Boolean function, start of the variable node at level 1 and follow the path based on true or false values until one of the terminal nodes (false or true) is reached.

Turning now to FIG. 6, a diagram of a table representation of the BDD in FIG. 5 is depicted in accordance with a preferred embodiment of the present invention. The index in column 602 represents the variable number. Three entries are present for each variable in this example. The variable level is located in column 604, the child for the low condition is located in column 606, and the child for the high condition is located in column 608. In this example, these three entries form a segment with table 600 showing six segments. Table 600 is identical to table 300 in FIG. 3 in organization.

Turning next to FIG. 7 a table combining entries for two binary decision diagrams is depicted in accordance with a preferred embodiment of the present invention. A table 700 is formed by the composition of table 400 for boolean function A from FIG. 4 in section 702 and table 600 for the boolean function B from FIG. 6 in section 704. Section 706 provides a common index for the data from both tables 400 and 600 within table 700. In actual practice, tens or hundreds of Boolean functions may be associated with an application and the resultant table will be based on the concatenation of all these tables from left to right ordered by the Boolean function number. In FIG. 7, only two such tables concatenated together in table 700 in this example. The number of rows in the combined table will equal the maximum number of rows from all of the individual tables. Of course other tables having a smaller number of indices may be added to table 700. All smaller tables are extended to this size by adding rows containing zeroes or some other symbol at the bottom of the table. When data compression is applied to the combined table, this redundancy of zeroes will not be expensive due to the high compression factors for these cases.

Consider table 700 in FIG. 7 and assume Boolean function A is numbered as function 0 and Boolean function B is numbered as function 1. The easiest way to represent this table is as a two-dimensional array; a C/C++ style indexing based at zero is assumed.

With reference now to FIG. 8, a diagram of an array structure is depicted in accordance with a preferred embodiment of the present invention. It is a simple transformation to look up any entry in the table. Normally, a triplet (var level, low, high) is fetched for a specified variable. In this example, the specified variable is "V", for a particular function, call it F. If the array is named D, the triplet of values will be found at: D[V−2][3*F], D[V−2][3*F+1], D[V−2][3*F+2]. For example, to find the triplet for variable 4 (V=4) in function B (F=1), the locations are: D[2][3], D[2][4], D[2][5], where the values are found to be 4, 1, and 2, respectively.

For large circuits, a combined table may require hundreds or thousands of megabytes of memory. Compression is vital if the table is to be maintained in memory for simulation and analysis of a circuit. Standard compression techniques, such as those used in ZIP files, are inappropriate because the entire set of data is compressed or uncompressed as a whole. Incremental decompression is used with the table structure outlined above in accordance with a preferred embodiment of the present invention. In other words, the entire compressed table is present in memory and individual triplets are decompressed on an as needed basis. Once decompressed, the values are stored in a buffer and can be referenced again without requiring decompression a second time.

A LZW algorithm may be used when the entire data set is compressed and then uncompressed. Ziv and Lempel first published their data compression algorithm in 1977. Welch published refinements to this algorithm in 1984. Since that time, the compression scheme has been known as the Lempel-Ziv-Welch (LZW) algorithm. This algorithm is based on replacing strings of characters with a single code. Every new input string of characters is added to a table of strings each with a single code representation. When a string is repeated, the single code is output rather than the entire string. Decompression converts the compressed text that combines strings and codes back into an identical copy of the original text. One reason the LZW algorithm is efficient is because it does not have to pass the string table to the decompression algorithm. Rather the table is reconstructed as the compressed code is received because the first occurrence of the string in the original text results in the string+ code being transmitted. There is one special case that has to be handled as an exception, but this does not make the algorithm overly complex.

The effectiveness of the compression is highly dependent on the data being processed. The more redundant the data, the higher the compression. English text will typically compress by at least 50 percent or a 2× compression. Other data with a large amount of redundancy can produce compression ratios up to 10×.

LZW can not be used in the present invention for random access because the decoding table is built dynamically as the input message is uncompressed. The present invention also provides a static global dictionary. More information on compressing data in a manner, which allows access to the data without full on compression is described in docket AT9-98-566 filed Dec. 11, 1998, serial number 09/210,503, and assigned to the same assignee of the present application and is incorporated herein by reference.

Figures 9, 10, 12:
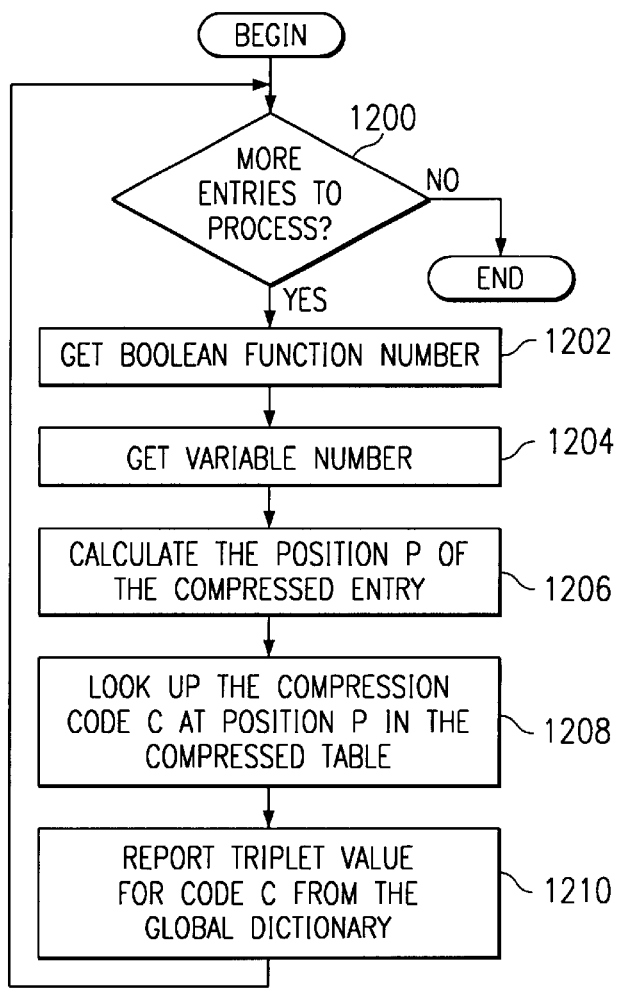
FIG. 9 is a diagram of the global static dictionary built based on the data shown in FIG. 8 depicted in accordance with a preferred embodiment of the present invention.
FIG. 10 is a compressed version of the table in FIG. 8 depicted in accordance with a preferred embodiment of the present invention.
FIG. 12 is a flowchart of a process for fetching triplets from a compressed BDD table depicted in accordance with a preferred embodiment of the present invention.

Turning to FIG. 9, a diagram of the global static dictionary built based on the data shown in FIG. 8 is depicted in accordance with a preferred embodiment of the present invention. In FIG. 10 a compressed version of the table in FIG. 8 is depicted in accordance with a preferred embodiment of the present invention. It is possible to compress the data in the combined table using any "stride" or segment value for grouping. A "stride" or segment of 3 items is shown in these examples. As a result, each row will compress to 6/3=2 entries in the compressed table. If the stride does not divide equally into the number of columns, columns may be added to the right side to pad the table width to a multiple of the stride. The combined table may be processed triplet-by-triplet (since the stride=3) and row-by-row. Each unique triplet will be entered into the global static dictionary and its position in the dictionary will indicate its encoding.

Figure 11:
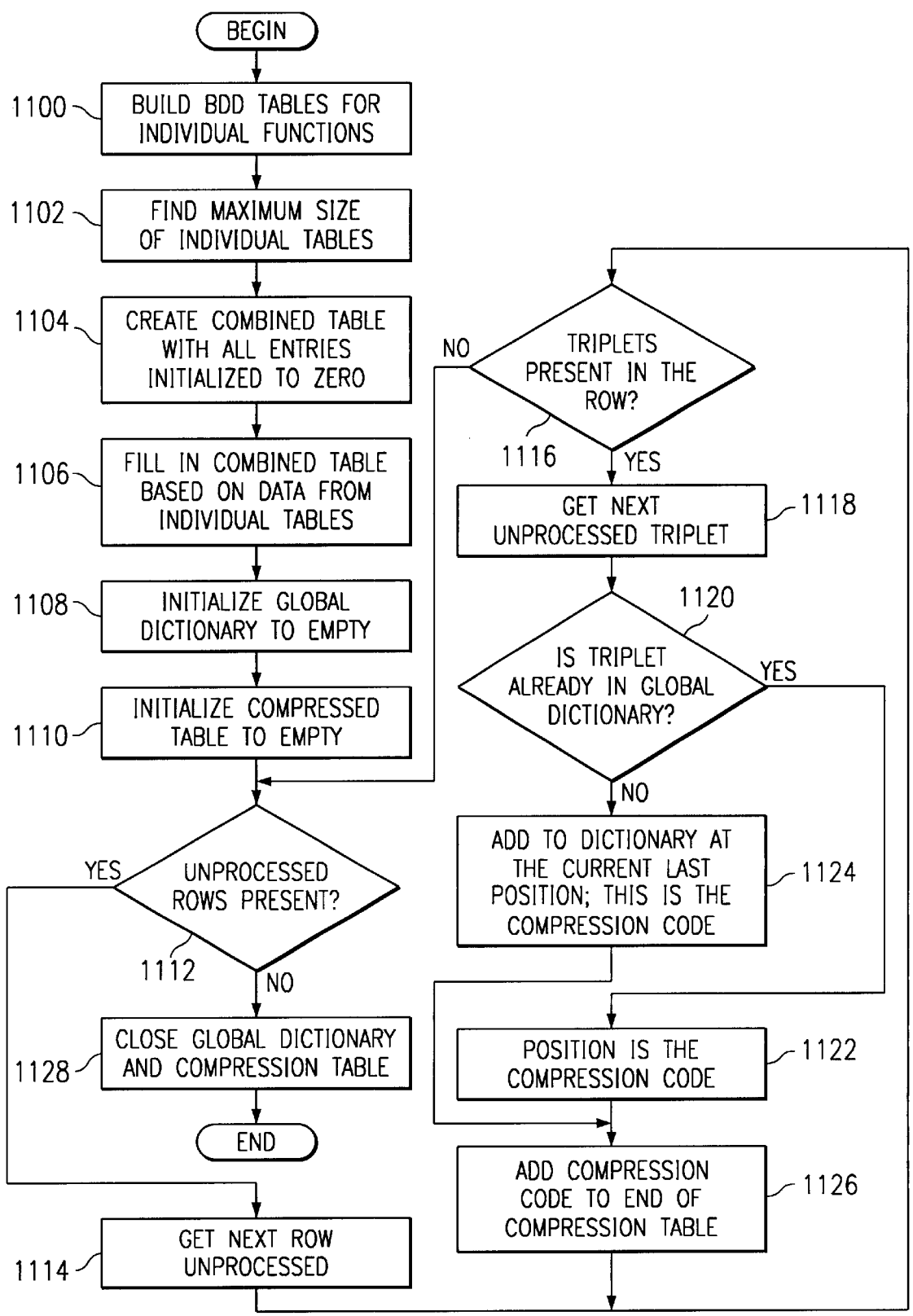
FIG. 11 is a flowchart of a process for building a compressed binary decision diagram table depicted in accordance with a preferred embodiment of the present invention.

With reference now to FIG. 11, a flowchart of a process for building a compressed binary decision diagram table is depicted in accordance with a preferred embodiment of the present invention. FIG. 11 is endnoted to provide an understanding of the process of building the global static dictionary and encoded the combined table, we refer to FIG. 11.

Each binary decision diagram is converted to table form (step 1100). In step 1100, a BDD table is created for each function. The maximum number of rows (M) for the largest table is determined (step 1102). Thereafter, a combined table is created in which all entries are initialized to 0 (step 1104). If N BDD tables are present, then a combined table with N*3 columns and M rows is created. For each BDD table transfer the data into the combined table (step 1106). Specifically, for the triplet of values for variable V in function F, the triplet will be entered into the combined table T at positions T[V−2][3*F], T[V−2][3*F+1], T[V−2][3*F+2]. Each triplet forms a segment.

A global dictionary is initialized to empty (step 1108). Thereafter, a compressed table is initialized to empty (step 1110). A determination is made as to whether rows are still present for processing in the combined table (step 1112). If rows are still present for processing, the next unprocessed row is obtained (step 1114). Thereafter, a determination is made as to whether any triplets are left in the row being processed (step 1116). If triplets still remain unprocessed in the row, then the next unprocessed triplet is obtained (step 1118).

For example, with reference to FIG. 8, the first triplet (4,1,0) in the first row of the combined table is entered in the dictionary at position zero and is encoded in the compressed table as zero. The next triplet (5,1,0) is not present in the dictionary, so it is entered in the first empty entry (position 1) and encoded by this position value. Thus, processing continues in this manner. For each row in the combined table 1112, if the row is not empty then its triplets are processed.

For each triplet in the row, the value is fetched and looked up in the global dictionary to see whether the triplet is present in the global dictionary (step 1120). If the triplet is already present in the dictionary then triplet's position is its encoding value (step 1122). With reference again to step 1120, if the triplet is absent from the dictionary, the triplet is added to the dictionary at the first empty value also known as the current last position (step 1124). This position becomes compression code for encoding the triplet. In either case in steps 1122 and 1124, the compression code is added to the end of the compression table (step 1126).

Thereafter, the process returns to step 1116 to determine whether additional triplets are present in the row for processing.

With reference again to step 1116, if no triplets are left in the row, the process then returns to step 1112 to determine whether additional rows are present for processing. In step 1112, if no additional rows are present for processing, the global dictionary and compressed table are closed (step 1128) with the process terminating thereafter. Processing continues until all triplets in the row have been encoded. This completes the compression process. Notice for the data in FIG. 8, only two duplicate entries are present: (3,2,3) at position 4 and (2,4,0) at position 6. If tens or hundreds of BDD functions are present, then the level of redundancy could be expected to be significantly higher.

A major advantage of this invention is that individual entries in the compressed table can be fetched without decompressing the entire table.

Turning now to FIG. 12, a flowchart of a process for fetching triplets from a compressed BDD table is depicted in accordance with a preferred embodiment of the present invention. The process illustrated in FIG. 12 retrieves a triplet, which is a portion of a BDD from a compressed table using a global dictionary. In this case, the global dictionary is a static dictionary, which may be stored somewhere on a storage device for accessing portions of a BDD table without having to uncompress the entire table.

This process begins by determining whether additional entries are present for processing (step 1200). If additional entries are present, the process then obtains the boolean function number (step 1202). Thereafter, the variable number is obtained for the entry (step 1204). The position P of the compressed entry is calculated (step 1206). The compression code C at position P is looked up in the compression table (step 1208). A triplet value is recorded for code C from the global dictionary (step 1210), with the process then returning to step 1200.

With reference again to step 1200, if additional entries are not present for processing, the process terminates. Entries need not be processed in-order; requests can arrive in any order. Suppose an entry is requested for the second function (F=1) and the fourth variable (V=4). Since the table has already been compressed, the total number of functions in the combined table (T=2 in this case) is known. The position may be calculated for the compressed entry as P=(V−2)*T+ F+1=(431 2)*2+1+1=6. The value is looked up in the compressed table 1208 at position 6 (assuming a one-dimensional structure) and find it is 5. The triplet is at position 5 in the global static dictionary. This triplet is returned (4,1,2).

Examining the data in FIG. 7, it can be seen that this is the correct triplet for the fourth variable of the second function. To show this works for duplicate entries too suppose the sixth variable (V=6) for the second function (F=1) is requested. P=4*2+1+1=10. The code in the compressed table to position 10 is 6 and the triplet at position 6 in the global dictionary is (2,4,0).

It is important to note that while the present invention has been described in the context of a fully functioning data processing system, those of ordinary skill in the art will appreciate that the processes of the present invention are capable of being distributed in a form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. Although the segment length used is a triplet having a length of 3, other segment lengths may be used in compressing and uncompressing a binary decision diagram. Additionally, although the examples are directed towards using a binary decision diagram for circuit simulation and analysis, this compression and uncompression technique may be used for other types of similar data structures such as, for example, binary trees and spanning trees. The embodiment was chosen and described in order to best explain the principles of the invention the practical application and to enable others of ordinary skill in the art to understand the invention for various embodiments with various modifications as are suited to the particular use contemplated.

What is claimed is:

1. A method in a data processing system for manipulating a set of binary decision diagrams, the method comprising the data processing system implemented steps of:

creating a plurality of segments from the set of binary decision diagrams; and associating a group of compression codes with the set of segments, wherein the group of compression codes form a compressed data structure representing the set of binary decision diagrams.

2. The method of claim 1, wherein each binary decision diagram within the set of binary decision diagrams includes a set of nodes in which each node comprises a triplet in which the triplet has a variable level number, a high value identifying a first node for a true result, and a low value identifying a second node for a false result and further comprising:

storing a plurality of triplets for the set of binary decision diagrams in a data structure, wherein a triplet within a plurality of triplets is accessed using a compression code from the group of compression codes; and using the data structure to selectively access a binary decision diagram from the set of binary decision diagrams.

3. The method of claim 2, wherein the data structure is a dictionary.

4. The method of claim 1, wherein the set of binary decision diagrams represent a set of circuits.

5. A method in a data processing system for manipulating a set of binary decision diagrams, the method comprising the data processing system implemented step of:

creating a first table for a plurality of binary decision diagrams, wherein the table has a plurality of rows and a plurality of columns, wherein each binary decision diagram includes a set of segments occupying the plurality of rows and a portion of the plurality of columns in the table;

storing information for a segment in a data structure of which a compression code is used to access the segment; and storing a plurality of compression codes in a second table, wherein each compression code is a pointer to a location in the data structure.

6. The method of claim 5, wherein each segment is a triplet.

7. The method of claim 5, wherein each segment includes a variable level for a node, a high value identifying a node for a true result, and a low value identifying a node for a false result.

8. The method of claim 5, wherein the plurality of binary decision diagrams represent a plurality of circuits.

9. The method of claim 5 further comprising:

accessing a binary decision diagram from the plurality of binary decision diagrams using the second table and the data structure.

10. The method of claim 5, wherein the data structure is a dictionary.

11. The method of claim 5, wherein the second table is located in a memory of the data processing system and wherein the global dictionary is located in a storage device.

12. A computer comprising:

a processor;

a memory coupled to the processor; and instructions located in a storage device, wherein the instructions are executable by the processor to create a first table for a plurality of binary decision diagrams, wherein the table has a plurality of rows and a plurality of columns, wherein each binary decision diagram includes a set of segments occupying the plurality of rows and a portion of the plurality of columns in the table; stores information for a segment in a data structure of which a compression code is used to access the segment; and to store a plurality of compression codes in a second table, wherein each compression code is a pointer to a location in the data structure.

13. The computer of claim 12 further comprising:

a storage device wherein the data structure is stored in a storage device and a random access memory and wherein a second table is located in the random access memory.

14. A data processing system for manipulating a set of binary decision diagrams, the data processing system comprising:

creating means for creating a plurality of segments from the set of binary decision diagrams; and associating means for associating a group of compression codes with the set of segments, wherein the group of compression codes form a compressed data structure representing the set of binary decision diagrams.

15. The data processing system of claim 14, wherein each binary decision diagram within the set of binary decision diagrams includes a set of nodes in which each node comprises a triplet in which the triplet has a variable level number, a high value identifying a first node for a true result, and a low value identifying a second node for a false result and further comprising:

storing means for storing a plurality of triplets for the set of binary decision diagrams in a data structure, wherein a triplet within a plurality of triplets is accessed using a compression code from the group of compression codes; and using means for using the data structure to selectively access a binary decision diagram from the set of binary decision diagrams.

16. The data processing system of claim 15, wherein the data structure is a dictionary.

17. The data processing system of claim 14, wherein the set of binary decision diagrams represent a set of circuits.

18. A data processing system for manipulating a set of binary decision diagrams, the data processing system comprising:

creating means for creating a first table for a plurality of binary decision diagrams, wherein the table has a plurality of rows and a plurality of columns, wherein each binary decision diagram includes a set of segments occupying the plurality of rows and a portion of the plurality of columns in the table;

first storing means for storing information for a segment in a data structure of which a compression code is used to access the segment; and second storing means for storing a plurality of compression codes in a second table, wherein each compression code is a pointer to a location in the data structure.

19. The data processing system of claim 18, wherein each segment is a triplet.

20. The data processing system of claim 18, wherein each segment includes a variable level for a node, a high value identifying a node for a true result, and a low value identifying a node for a false result.

21. The data processing system of claim 18, wherein the plurality of binary decision diagrams represent a plurality of circuits.

22. The data processing system of claim 18 further comprising:

accessing means for accessing a binary decision diagram from the plurality of binary decision diagrams using the second table and the data structure.

23. The data processing system of claim 18, wherein the data structure is a dictionary.

24. The data processing system of claim 18, wherein the second table is located in a memory of the data processing system and wherein the global dictionary is located in a storage device.

25. A computer program product in a computer readable medium for manipulating a set of binary decision diagrams, the computer program product comprising:

first instructions for creating a plurality of segments from the set of binary decision diagrams; and second instructions for associating a group of compression codes with the set of segments, wherein the group of compression codes form a compressed data structure representing the set of binary decision diagrams.

26. A computer program product in a computer readable medium for manipulating a set of binary decision diagrams, the computer program product comprising:

first instructions for creating a first table for a plurality of binary decision diagrams, wherein the table has a plurality of rows and a plurality of columns, wherein each binary decision diagram includes a set of segments occupying the plurality of rows and a portion of the plurality of columns in the table;

second instructions for storing information for a segment in a data structure of which a compression code is used to access the segment; and third instructions for storing a plurality of compression codes in a second table, wherein each compression code is a pointer to a location in the data structure.

* * * * *

UNITED STATES PATENT AND TRADEMARK OFFICE
CERTIFICATE OF CORRECTION

PATENT NO.    : 6,385,617 B1
DATED         : May 7, 2002
INVENTOR(S)   : Malik

It is certified that error appears in the above-identified patent and that said Letters Patent is hereby corrected as shown below:

<u>Column 1,</u>
Line 41, after "August", please delete "1998" and insert -- 1986 --.

Signed and Sealed this

Thirty-first Day of December, 2002

JAMES E. ROGAN
*Director of the United States Patent and Trademark Office*